United States Patent
Lizenberg et al.

(10) Patent No.: US 8,961,688 B2
(45) Date of Patent: Feb. 24, 2015

(54) METHOD AND DEVICE FOR PLASMA TREATING WORKPIECES

(75) Inventors: Michael Lizenberg, Geesthacht (DE); Frank Lewin, Tangstedt (DE); Hartwig Müller, Lütjensee (DE); Klaus Vogel, Barsbüttel (DE); Gregor Arnold, Bodenheim (DE); Stephan Behle, Hahnheim (DE); Andreas Lüttringhaus-Henkel, Darmstadt (DE); Matthias Bicker, Mainz (DE); Jürgen Klein, Mainz (DE); Marten Walther, Engelstadt (DE)

(73) Assignee: KHS Corpoplast GmbH, Hamburg (DE)

( * ) Notice: Subject to any disclaimer, the term of this patent is extended or adjusted under 35 U.S.C. 154(b) by 1492 days.

(21) Appl. No.: 10/515,610

(22) PCT Filed: May 9, 2003

(86) PCT No.: PCT/DK03/01505
§ 371 (c)(1),
(2), (4) Date: Jun. 17, 2005

(87) PCT Pub. No.: WO03/100125
PCT Pub. Date: Dec. 4, 2003

(65) Prior Publication Data
US 2005/0233077 A1    Oct. 20, 2005

(30) Foreign Application Priority Data

May 24, 2002 (DE) .................................. 102 23 288
Jun. 7, 2002 (DE) .................................. 102 25 609

(51) Int. Cl.
*C23C 16/452* (2006.01)
*C23C 16/511* (2006.01)
(Continued)

(52) U.S. Cl.
CPC .............. *C23C 16/4409* (2013.01); *B08B 7/00* (2013.01); *B08B 9/426* (2013.01); *B29C 49/421* (2013.01);
(Continued)

(58) Field of Classification Search
USPC ................. 118/715, 716, 717, 718, 719, 720, 118/723 R, 723 MP, 723 MW, 729, 730
See application file for complete search history.

(56) References Cited

U.S. PATENT DOCUMENTS 3,862,020 A * 1/1975 Woerner et al. .................. 264/81
4,609,772 A * 9/1986 Grolitzer ........................ 136/254
(Continued)

FOREIGN PATENT DOCUMENTS

FR    WO 00/58631    * 10/2000
WO    WO 9917334    * 4/1999

*Primary Examiner* — Parviz Hassanzadeh
*Assistant Examiner* — Satish Chandra
(74) *Attorney, Agent, or Firm* — Lucas & Mercanti, LLP; Klaus P. Stoffel (57) ABSTRACT

Disclosed are a method and a device for plasma treating workpieces (5). Said workpiece is inserted into a chamber (7) of a treatment station (3), which can be at least partly evacuated, and is positioned within the treatment station by means of a holding element. In order to simultaneously supply at least two chambers with at least one operating means, a flow of the operating means is branched at least once so as to form at least two partial flows (55).

30 Claims, 12 Drawing Sheets (51) Int. Cl.
  *C23C 16/52* (2006.01)
  *C23C 16/44* (2006.01)
  *B08B 7/00* (2006.01)
  *B08B 9/42* (2006.01)
  *B29C 49/42* (2006.01)
  *B65D 23/02* (2006.01)
  *B65G 29/00* (2006.01)
  *C08J 9/00* (2006.01)
  *C23C 14/04* (2006.01)
  *C23C 14/50* (2006.01)
  *C23C 14/56* (2006.01)
  *C23C 16/04* (2006.01)
  *C23C 16/40* (2006.01)
  *C23C 16/455* (2006.01)
  *C23C 16/458* (2006.01)
  *C23C 16/50* (2006.01)
  *C23C 16/54* (2006.01)
  *H01J 37/32* (2006.01)
  *B05D 1/00* (2006.01)
  *B29C 49/02* (2006.01)
  *B29K 77/00* (2006.01)

(52) U.S. Cl.
  CPC ............... *B65D 23/02* (2013.01); *B65G 29/00* (2013.01); *C08J 9/0004* (2013.01); *C23C 14/046* (2013.01); *C23C 14/505* (2013.01); *C23C 14/56* (2013.01); *C23C 16/045* (2013.01); *C23C 16/401* (2013.01); *C23C 16/455* (2013.01); *C23C 16/458* (2013.01); *C23C 16/50* (2013.01); *C23C 16/511* (2013.01); *C23C 16/54* (2013.01); *H01J 37/32733* (2013.01); *B05D 1/62* (2013.01); *B29C 2049/026* (2013.01); *B29C 2049/027* (2013.01); *B29C 2791/001* (2013.01); *B29K 2077/00* (2013.01); *B29K 2995/0067* (2013.01); *B65G 2201/0244* (2013.01); *C08J 2300/14* (2013.01); *B29C 2049/4221* (2013.01)
  USPC ............ 118/715; 118/730; 118/716; 118/717; 118/718; 118/719; 118/720; 118/723 R; 118/723 MP; 118/729

(56) References Cited

U.S. PATENT DOCUMENTS

| | | | | |
|---|---|---|---|---|
| 4,969,790 | A * | 11/1990 | Petz et al. | 414/217 |
| 5,324,361 | A * | 6/1994 | Etzkorn et al. | 118/719 |
| 5,324,540 | A * | 6/1994 | Terada | 427/255.5 |
| 5,460,654 | A * | 10/1995 | Kikkawa et al. | 118/726 |
| 5,679,412 | A * | 10/1997 | Kuehnle et al. | 427/534 |
| 6,074,486 | A * | 6/2000 | Yang et al. | 118/719 |
| 6,139,642 | A * | 10/2000 | Shimahara et al. | 118/724 |
| 6,156,151 | A * | 12/2000 | Komino et al. | 156/345.29 |
| 6,524,650 | B1 * | 2/2003 | Shimahara et al. | 427/248.1 |
| 6,565,791 | B1 * | 5/2003 | Laurent | 264/455 |
| 6,818,068 | B1 * | 11/2004 | Guiffant et al. | 118/719 |
| 2001/0042510 | A1 * | 11/2001 | Plester | 118/723 E |
| 2001/0045224 | A1 * | 11/2001 | Kamikawa et al. | 134/61 |
| 2002/0020429 | A1 * | 2/2002 | Selbrede et al. | 134/1.1 |
| 2005/0087893 | A1 * | 4/2005 | Chung et al. | 257/E21.311 |

* cited by examiner

METHOD AND DEVICE FOR PLASMA TREATING WORKPIECES

BACKGROUND OF THE INVENTION

1. Field of the Invention

The invention concerns a method for the plasma treatment of workpieces, wherein the workpiece is inserted in a plasma chamber of a treatment station, which can be at least partially evacuated, and wherein the workpiece is positioned inside the treatment station by a mounting element.

The invention also concerns a device for the plasma treatment of workpieces, which has at least one plasma chamber, which can be evacuated, for holding the workpieces, in which the plasma chamber is located in the area of a treatment station, and in which the plasma chamber is bounded by a chamber floor, a chamber lid, and a lateral chamber wall and has at least one mounting element for positioning the workpiece.

2. Description of the Related Art

Processes and devices of this type are used, for example, to apply surface coatings to plastics. In particular, processes and devices of this type are also already known for coating inner or outer surfaces of containers used for holding liquids. Devices for plasma sterilization are also well known.

PCT-WO 95/22413 describes a plasma chamber for coating the inner surface of PET bottles. The bottles to be coated are raised into a plasma chamber by a movable base and connected at their mouths to an adapter. The inside of the bottles can be evacuated through the adapter. A hollow lance for supplying process gas is also inserted into the inside of the bottles through the adapter. Microwaves are used to ignite the plasma.

The same publication also describes the arrangement of a plurality of plasma chambers on a rotating wheel. This helps achieve a high production rate of bottles per unit time.

EP-OS 10 10 773 describes a feeding device for evacuating the inside of a bottle and supplying it with process gas. PCT-WO 01/31680 describes a plasma chamber into which the bottles are introduced by a movable lid that has first been connected with the mouths of the bottles.

PCT-WO 00/58631 also already describes the arrangement of plasma stations on a rotating wheel and the assignment of groups of vacuum pumps and plasma stations for an arrangement of this type to help provide favorable evacuation of the chambers and the interiors of the bottles. It also mentions the coating of several containers in a common plasma station or a common cavity.

Another system for coating the inside surfaces of bottles is described in PCT-WO 99/17334. This document describes especially an arrangement of a microwave generator above the plasma chamber and means for evacuating the plasma chamber and supplying it with operating agents through the floor of the plasma chamber.

In most of the previously known methods, silicon oxide coatings, which have the general chemical formula $SiO_x$ and are produced by the plasma, are used to improve the barrier properties of the thermoplastic material. In addition, barrier layers produced in this way can also contain carbon, hydrogen, and nitrogen components. Barrier layers of this type prevent oxygen from penetrating the bottled liquids and prevent the escape of carbon dioxide from liquids that contain $CO_2$.

The previously known methods and devices are still not sufficiently suitable for use in a mass-production process, in which it is necessary to achieve both a low coating cost per workpiece and a high production rate.

SUMMARY OF THE INVENTION

Therefore, the objective of the present invention is to develop a method of the aforementioned type in such a way that the operating agents can be effectively supplied to the treatment station, and a compact construction, short process idle times, and a high degree of reliability can be achieved at the same time.

In accordance with the invention, this objective is achieved by splitting a stream of the operating agents at least once into two split streams to supply at least two chambers with at least one operating agent at the same time.

A further objective of the present invention is to design a device of the aforementioned type that allows operating agents to be supplied to the plasma chamber and to achieve a compact construction at the same time.

In accordance with the invention, this objective is achieved by connecting at least two plasma chambers to at least one junction for splitting a stream of an operating agent into at least two split streams.

The simultaneous supplying of several chambers and the splitting of at least one stream of an operating agent result in a very compact unit, which helps achieve a spatially dense arrangement of several plasma chambers side by side and facilitates both assembly and subsequent service work. Furthermore, the splitting results in very short connecting ducts, which in turn result in a reduction of process idle times, since, for example, during vacuum feeding, the connecting ducts must also be evacuated, which results in a corresponding expenditure of time.

Favorable flow guidance is assisted by carrying out the splitting in a vertical direction.

Another variant consists in carrying out the splitting in a horizontal direction.

When hollow workpieces that are arranged with their mouths directed downward are being coated, it is found to be advantageous for a cavity of the plasma station to be evacuated through the chamber floor.

A simple realization with respect to equipment is also supported by supplying process gas through the chamber floor.

Fast and uniform distribution of the process gas in the interior of the workpiece can be achieved by supplying the process gas to the interior of the workpiece through a lance.

To supply operating agents to a space of the plasma chamber that surrounds the workpiece, it is proposed that at least one operating agent be directly introduced into at least two chambers from at least one junction.

To supply the interior of the workpiece, it is proposed that at least one operating agent be introduced into the interiors of at least two workpieces from at least one junction.

Systematic local introduction of operating agents into the interior of the workpiece is assisted by introducing at least one operating agent into at least two lances from at least one junction.

In all plasma applications, it is found to be advantageous for a vacuum feed to be distributed from the junction.

When plasma coatings are being carried out, it is intended that the process gas feed be distributed from the junction.

Simple termination of a given processing operation is assisted by distributing the air feed from the junction.

To help achieve controllable ignition of the plasma, it is proposed that microwaves generated by a microwave generator in the vicinity of the chamber lid be introduced into the cavity.

A typical application consists in the treatment of a workpiece made of a thermoplastic material.

The method is intended especially for treating the interior of the workpiece.

A large area of application consists in the treatment of containers as the workpieces.

In this regard, it is intended especially that a beverage bottle be treated as the workpiece.

A high production rate with a high degree of reliability and high product quality can be achieved by transferring the one or more plasma stations from an input position to an output position by a rotating plasma wheel.

An increase in production capacity with only a slight increase in equipment expense can be achieved if one plasma station comprises several cavities.

Further design simplification is assisted by distributing the microwave feed from the junction.

A typical application is defined as the performance of a plasma coating as the plasma treatment.

It is intended especially that the plasma treatment be carried out with the use of a low-pressure plasma.

In the case of the coating of plastic workpieces, it has been found to be advantageous to carry out a plasma polymerization.

Good surface adhesion is promoted if at least some of the substances deposited by the plasma are organic substances.

Especially advantageous practical properties of workpieces to be used for packaging foods can be obtained if at least some of the substances deposited by the plasma are inorganic substances.

In the treatment of packages, it is intended especially that a substance that improves the barrier properties of the workpiece be deposited by the plasma.

To promote high practical quality, it is proposed that an adhesion promoter be additionally deposited on a surface of the workpiece to improve the adhesion of the substance.

High productivity can be promoted by simultaneously treating at least two workpieces in a common cavity.

Another area of application consists in the performance of a plasma sterilization as the plasma treatment.

The method can also be used to carry out a surface activation of the workpiece as the plasma treatment.

The expense for igniting the plasma can be reduced by connecting at least one junction to at least one microwave generator.

Effective evacuation of the plasma chambers is assisted by connecting at least one junction to a primary vacuum valve for connecting a first negative pressure.

To prevent deformations of the workpiece, it is proposed that the primary vacuum valve at least temporarily connect both the interior of the workpiece and another interior space of the plasma chamber to a common vacuum source.

For fast evacuation with little expense, it is found to be advantageous to connect at least one junction to a secondary vacuum valve for connecting a lower negative pressure relative to the first negative pressure.

To produce a lower negative pressure in the interior of the workpiece relative to the rest of the plasma chamber, it is proposed that the secondary vacuum valve at least temporarily connect exclusively the interior of the workpiece with the vacuum source.

Deformation of a workpiece whose treatment has been completed is likewise prevented by connecting at least one junction to a workpiece ventilation valve for connecting the interior of the workpiece to ambient pressure.

To help achieve easy opening of the plasma chamber, it is proposed that at least one junction be connected to a chamber ventilation valve for connecting the interior of the plasma chamber to ambient pressure.

Process gas feed is assisted by connecting at least one junction to a primary process gas valve.

To allow successive feeding of process gases with different compositions, it is proposed that at least one junction be connected to a secondary process gas valve.

Maintenance of the negative pressure while the plasma treatment operation is being carried out is assisted by connecting at least one junction to a process vacuum valve.

Partitioning of the interior of the workpiece from another interior of the plasma chamber is assisted by connecting at least one junction to a chamber vacuum valve.

A compact design can be provided by arranging at least one junction in the area of a chamber base of the plasma station.

To promote good accessibility, it is especially useful for at least one junction to be arranged vertically below the chamber floor.

A very compact design can be provided if at least one junction forms a common component with the chamber base.

The arrangement of at least two of the valves in the area of a common valve block also contributes to a compact design.

A very space-saving design can be achieved by arranging at least one of the junctions in the area of the valve block.

In particular, to help achieve simple assembly and simple performance of service work, the valve block with the two or more valves and the one or more junctions can be arranged vertically below the chamber base.

A further increase in compactness can be achieved if the valve block forms a common component with at least one junction.

Control that can be adapted to different application specifications is provided by designing at least one of the valves as an electromagnetically controlled valve.

Specific embodiments of the invention are schematically illustrated in the drawings.

DETAILED DESCRIPTION OF THE INVENTION

Figure 1:
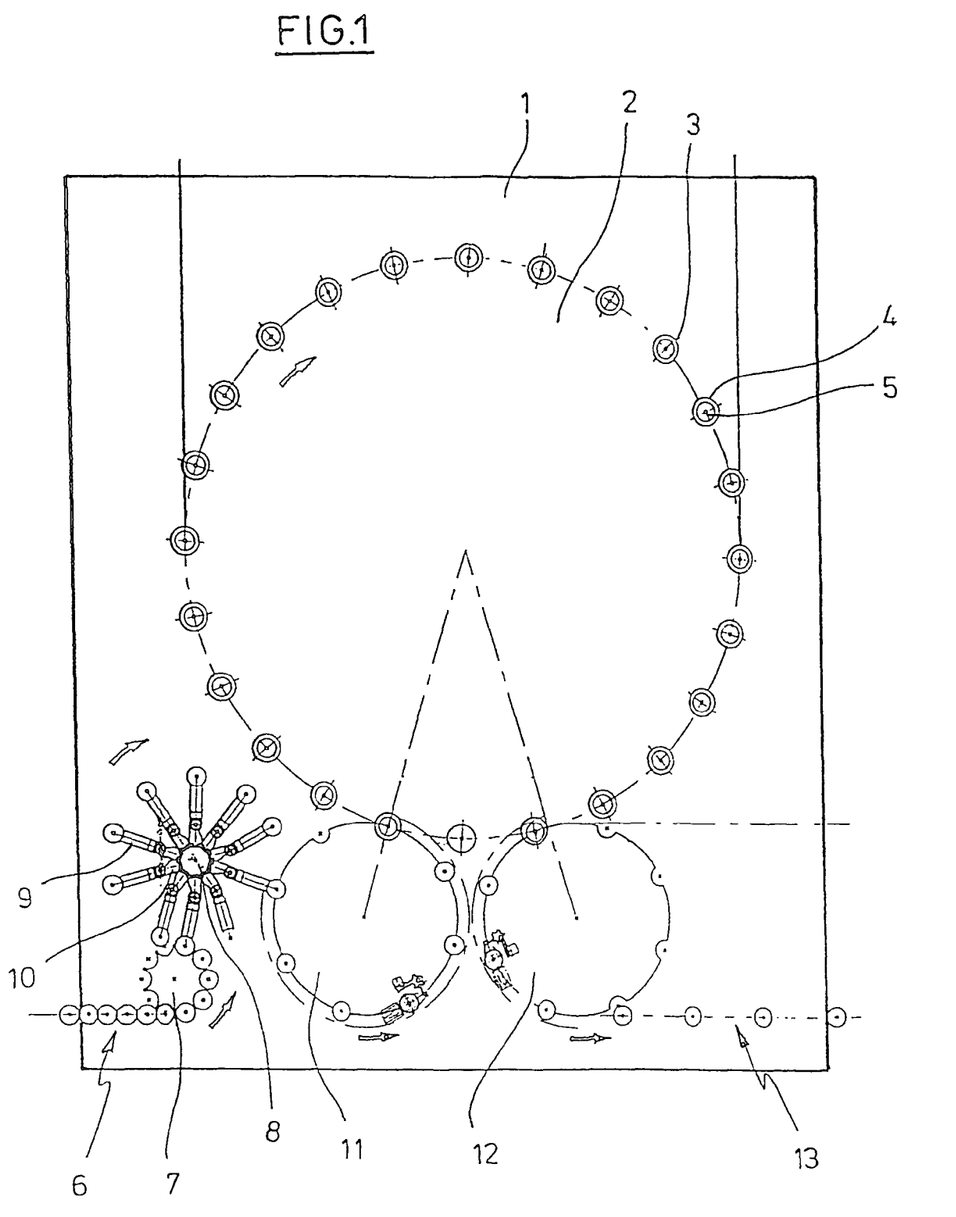
FIG. 1 shows a schematic diagram of a plurality of plasma chambers, which are arranged on a rotating plasma wheel, which is coupled with input and output wheels.

The view in FIG. 1 shows a plasma module (1), which is provided with a rotating plasma wheel (2). A plurality of plasma stations (3) is arranged along the circumference of the plasma wheel (2). The plasma stations (3) are provided with cavities (4) and plasma chambers (17) for holding the workpieces (5) that are to be treated.

The workpieces to be treated (5) are fed to the plasma module (1) in the region of an input (6) and further conveyed by an isolating wheel (7) to a transfer wheel (8), which is equipped with positionable support arms (9). The support arms (9) are mounted in such a way that they can be swiveled relative to a base (10) of the transfer wheel (8), so that the spacing of the workpieces (5) relative to one another can be changed. In this way, the workpieces (5) are transferred from the transfer wheel (8) to an input wheel (11) with increased spacing of the workpieces (5) relative to one another compared to the isolating wheel (7). The input wheel (11) transfers the workpieces (5) to be treated to the plasma wheel (2). After the treatment has been carried out, the treated workpieces (5) are removed from the area of the plasma wheel (2) by an output wheel (12) and transferred to the area of an output line (13).

Figure 2:
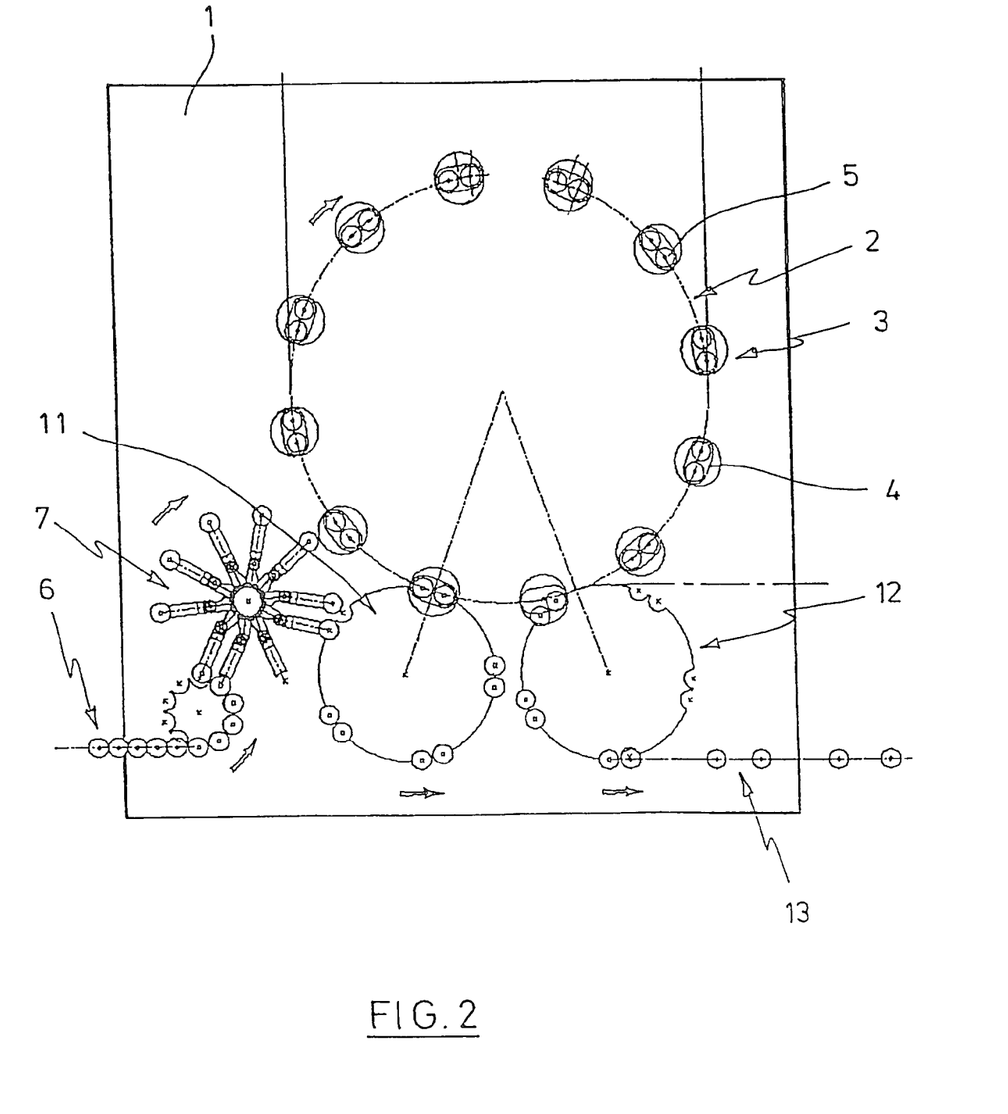
FIG. 2 shows an arrangement similar to FIG. 1, in which each plasma station is equipped with two plasma chambers.

In the embodiment shown in FIG. 2, each plasma station (3) is equipped with two cavities (4) and plasma chambers (17). This makes it possible to treat two workpieces (5) at a time. In this connection, it is basically possible to design the cavities (4) completely separate, but it is also basically possible to separate only sections of a common cavity space from each other in such a way that optimum coating of all workpieces (5) is ensured. In particular, it is intended here that the cavity sections be separated from each other at least by separate microwave couplings.

Figure 3:
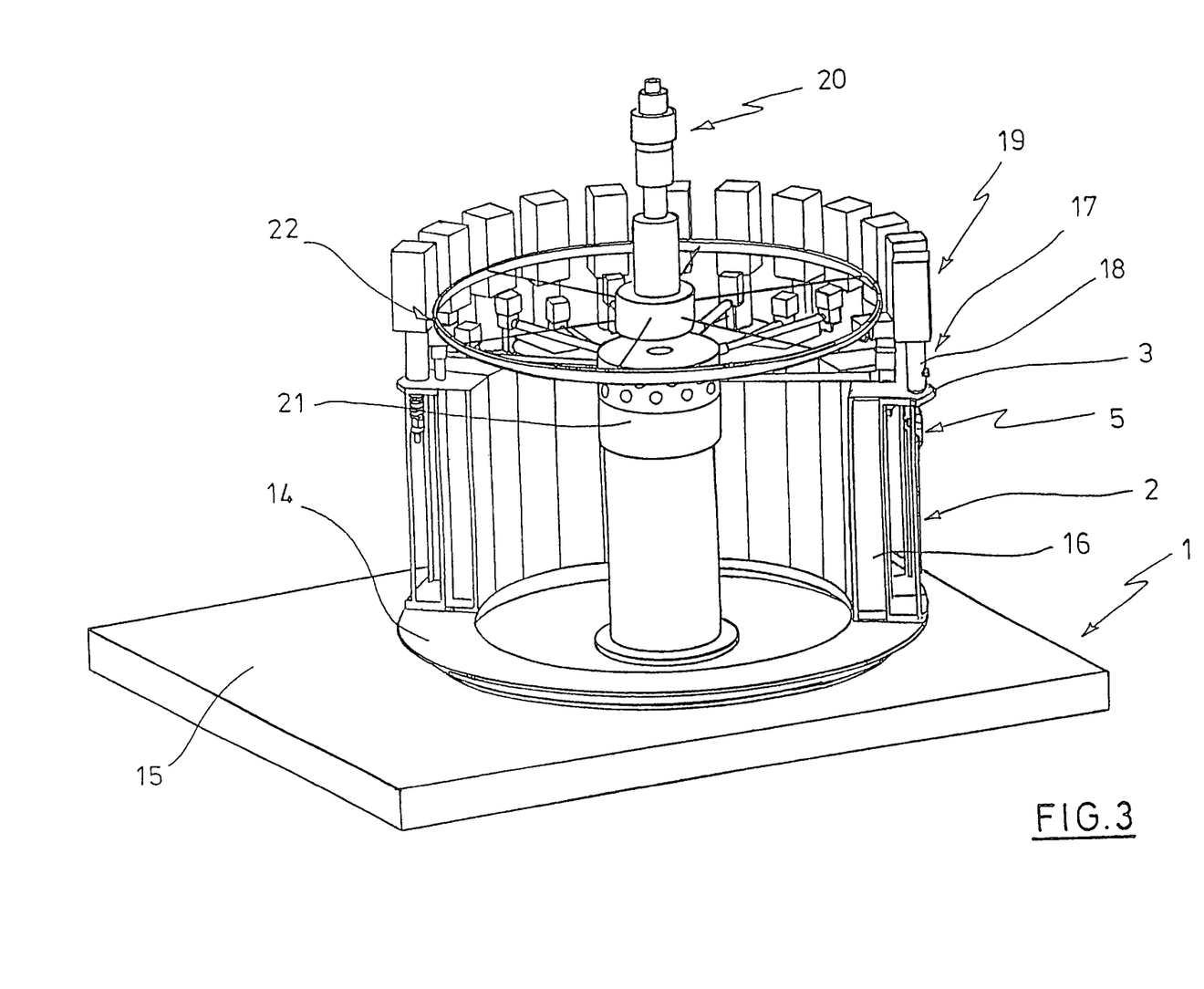
FIG. 3 shows a perspective view of a plasma wheel with a plurality of plasma chambers.

FIG. 3 shows a perspective view of a plasma module (1) with a partially assembled plasma wheel (2). The plasma stations (3) are installed on a supporting ring, which is designed as part of a revolving joint and is mounted in the area of a machine base (15). Each plasma station (3) has a station frame (16), which supports plasma chambers (17). The plasma chambers (17) have cylindrical chamber walls (18) and microwave generators (19).

A rotary distributor (20), by which the plasma stations (3) are supplied with operating agents and power, is located in the center of the plasma wheel (2). Especially ring conduits (21) can be used for distribution of the operating agents.

The workpieces (5) to be treated are shown below the cylindrical chamber walls (18). For the sake of simplicity, lower parts of the plasma chambers (17) are not shown in the drawing.

Figure 4:
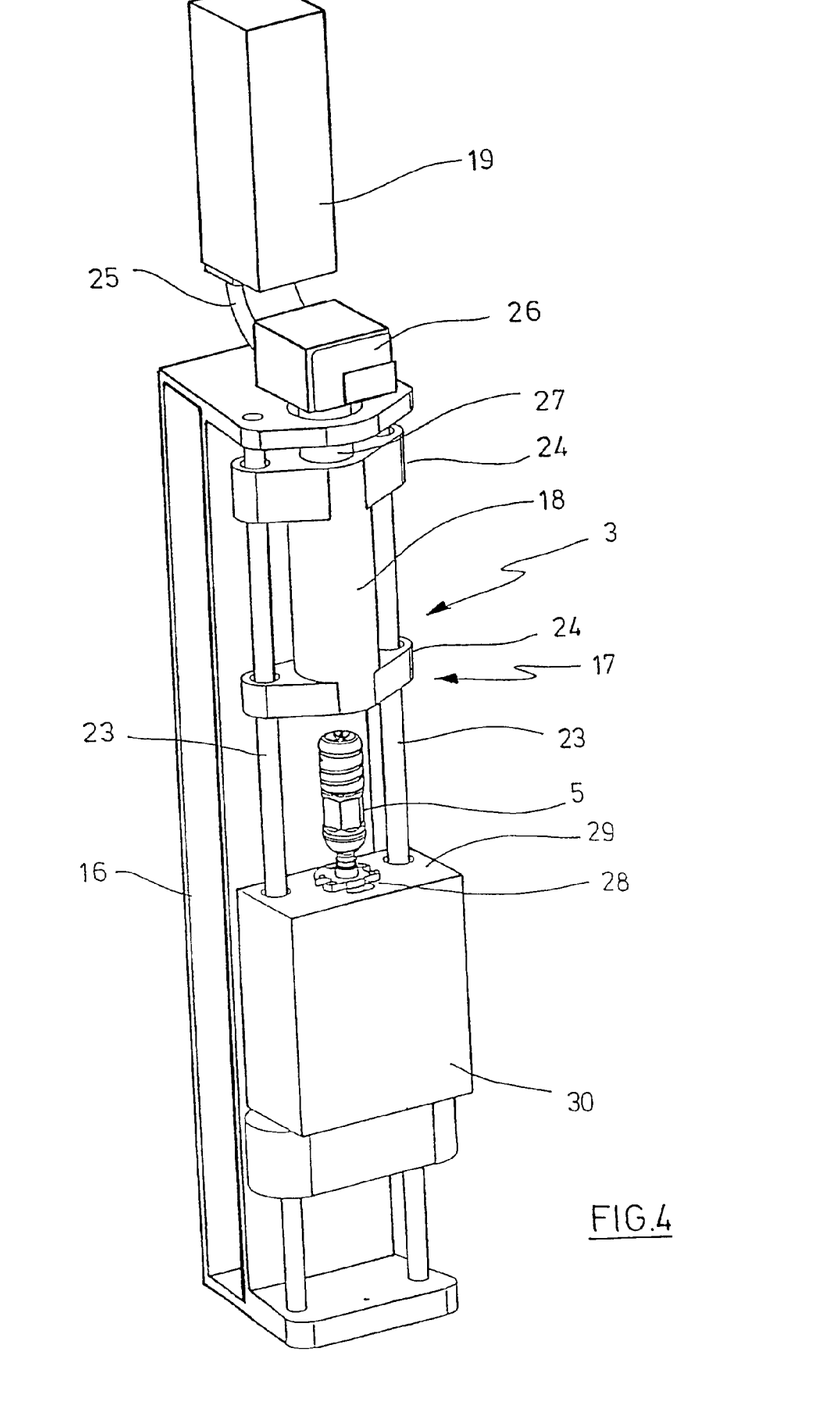
FIG. 4 shows a perspective view of a plasma station with one cavity.

FIG. 4 shows a perspective view of a plasma station (3). The drawing shows that the station frame (16) is provided with guide rods (23), on which a slide (24) for mounting the cylindrical chamber wall (18) is guided. FIG. 4 shows the slide (24) with the chamber wall (18) in its raised position, so that the workpiece (5) is exposed.

The microwave generator (19) is located in the upper region of the plasma station (3). The microwave generator (19) is connected by a guide (25) and an adapter (26) to a coupling duct (27), which opens into the plasma chamber (19). Basically, the microwave generator (19) can be installed directly in the vicinity of the chamber lid (31) or coupled with the chamber lid (31) at a predetermined distance from the chamber lid (31) via a spacing element and thus installed in a larger surrounding area of the chamber lid (31). The adapter (26) acts as a transition element, and the coupling duct (27) is designed as a coaxial conductor. A quartz glass window is installed in the area of the opening of the coupling duct (27) into the chamber lid (31). The guide (25) is designed as a waveguide.

The workpiece (5) is positioned in the area of a sealing element (28), which is located in the vicinity of the chamber floor (29). The chamber floor (29) is formed as part of a chamber base (30). To facilitate adjustment, it is possible to mount the chamber base (30) in the area of the guide rods (23). An alternative is to mount the chamber base (30) directly on the station frame (16). In an arrangement of this type, it is also possible, for example, to design the guide rods (23) in two parts in the vertical direction.

Figures 5, 6:
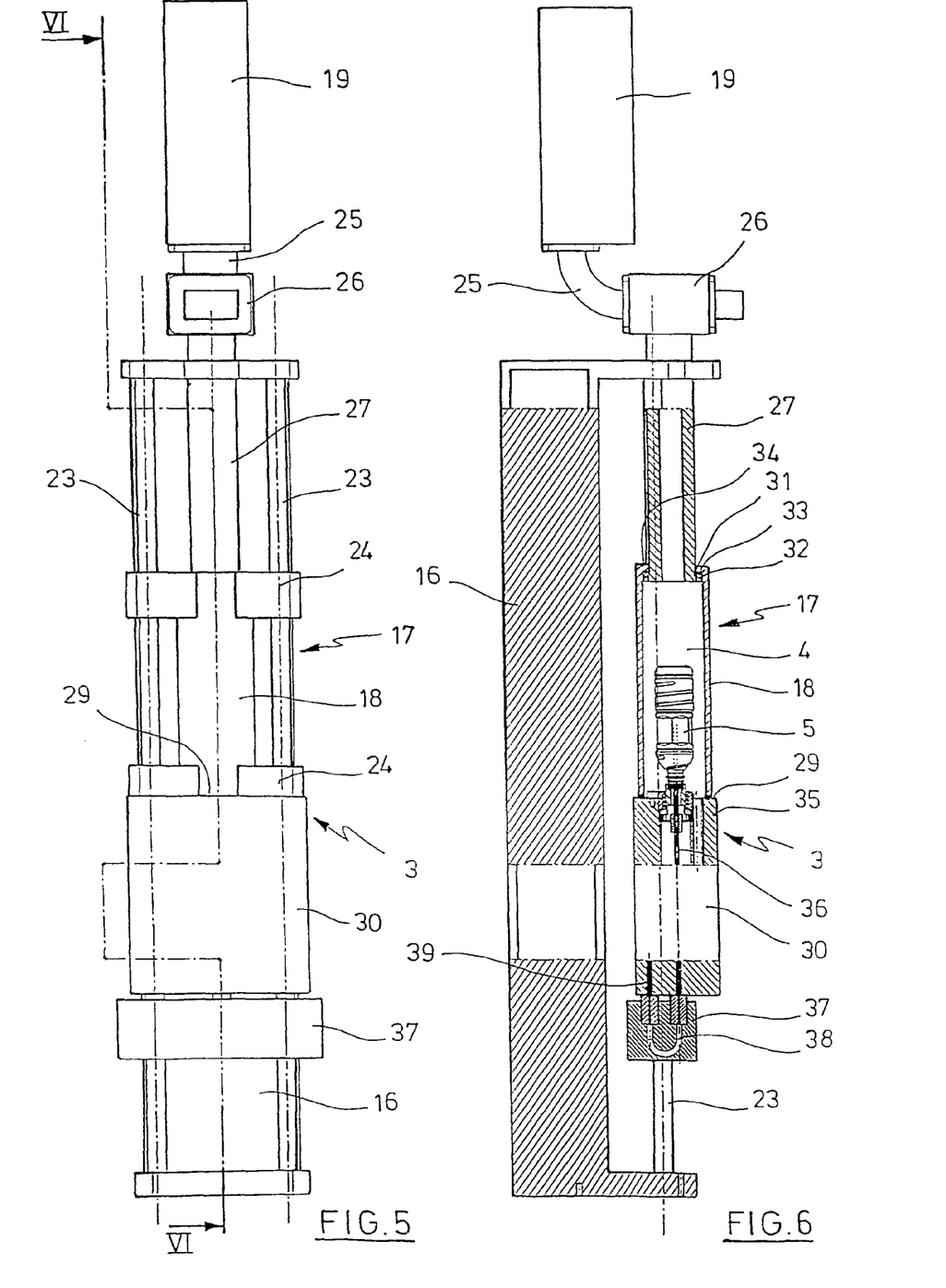
FIG. 5 shows a front elevation of the device in FIG. 4 with the plasma chamber closed.
FIG. 6 shows a cross section along cross-sectional line VI-VI in FIG. 5.

FIG. 5 shows a front elevation of the plasma station (3) of FIG. 3 with the plasma chamber (17) closed. The slide (24) with the cylindrical chamber wall (18) is lowered here relative to the position in FIG. 4, so that the chamber wall (18) is moved against the chamber floor (29). In this position, the plasma coating can be carried out.

FIG. 6 shows a vertical sectional view of the arrangement in FIG. 5. It is especially apparent that the coupling duct (27) opens into a chamber lid (31), which has a laterally projecting flange (32). A seal (33), which is acted upon by an inner flange (34) of the chamber wall (18), is located in the area of the flange (32). When the chamber wall (18) is lowered, the chamber wall (18) becomes sealed relative to the chamber lid (31). Another seal (35) is located in the lower region of the chamber wall (18) to ensure sealing relative to the chamber floor (29).

In the position shown in FIG. 6, the chamber wall (18) encloses the cavity (4), so that both the interior of the cavity (4) and the interior of the workpiece (5) can be evacuated. To assist with the introduction of process gas, a hollow lance (36) is mounted in the area of the chamber base (30) and can be moved into the interior of the workpiece (5). To allow positioning of the lance (36), the lance is supported by a lance slide (37), which can be positioned along the guide rods (23). A process gas channel (38) runs inside the lance slide (37). In its raised position shown in FIG. 6, the process gas channel (38) is coupled with a gas connection (39) of the chamber base (30). This arrangement eliminates hose-like connecting elements on the lance slide (37).

Figure 7:
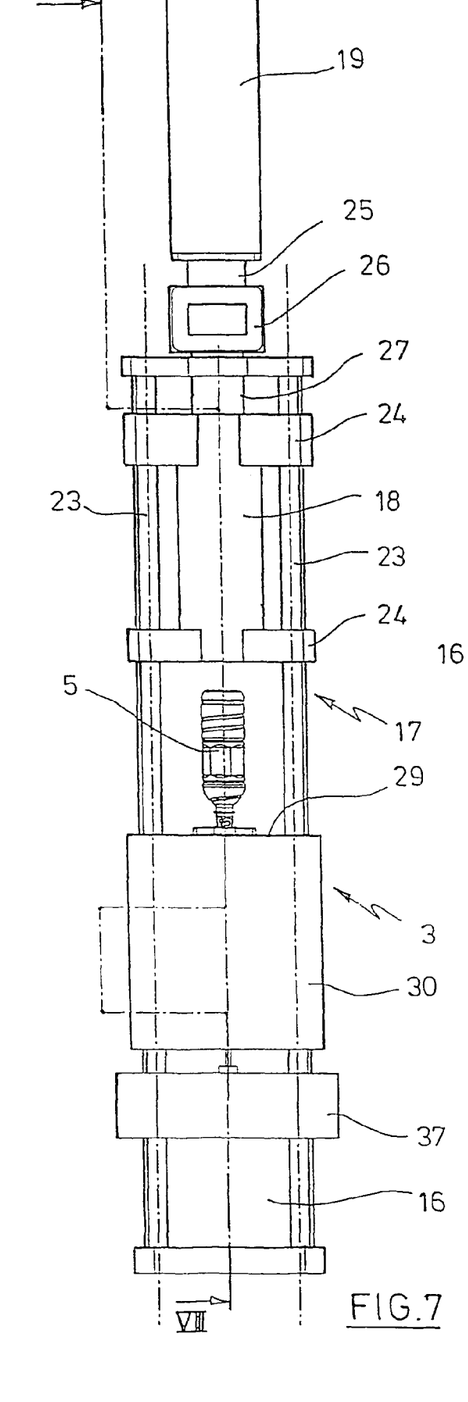
FIG. 7 shows the same view as in FIG. 5 but with the plasma chamber open.
Figure 8:
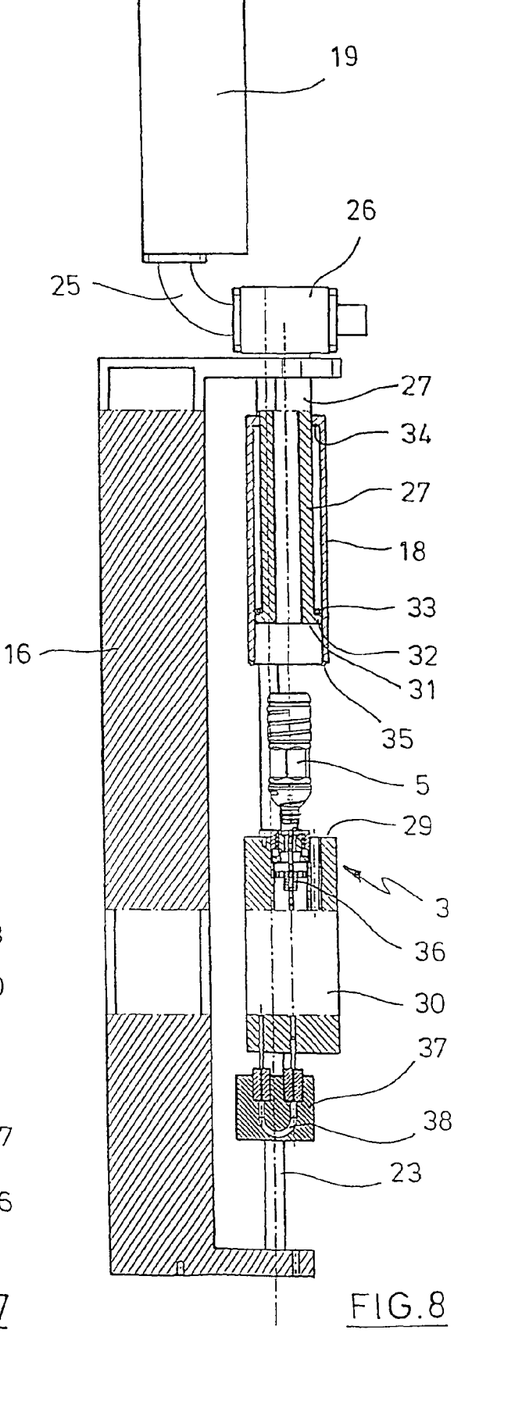
FIG. 8 shows a vertical section along cross-sectional line VIII-VIII in FIG. 7.

FIGS. 7 and 8 show the arrangement of FIGS. 5 and 6 with the chamber wall (18) in its raised position. When the chamber wall (18) is positioned in this way, the treated workpiece (5) can be removed from the area of the plasma station (3) without any problems, and a new workpiece (5) to be treated can be inserted. Alternatively to the positioning of the chamber wall (18) that is shown in the drawing, with the plasma chamber (17) in an open state produced by upward movement of the chamber wall (18), it is also possible to perform the opening operation by moving a structurally modified, sleeve-like chamber wall vertically downward.

In the illustrated embodiment, the coupling duct (27) has a cylindrical shape and is arranged essentially coaxially with the chamber wall (18).

Figure 9:
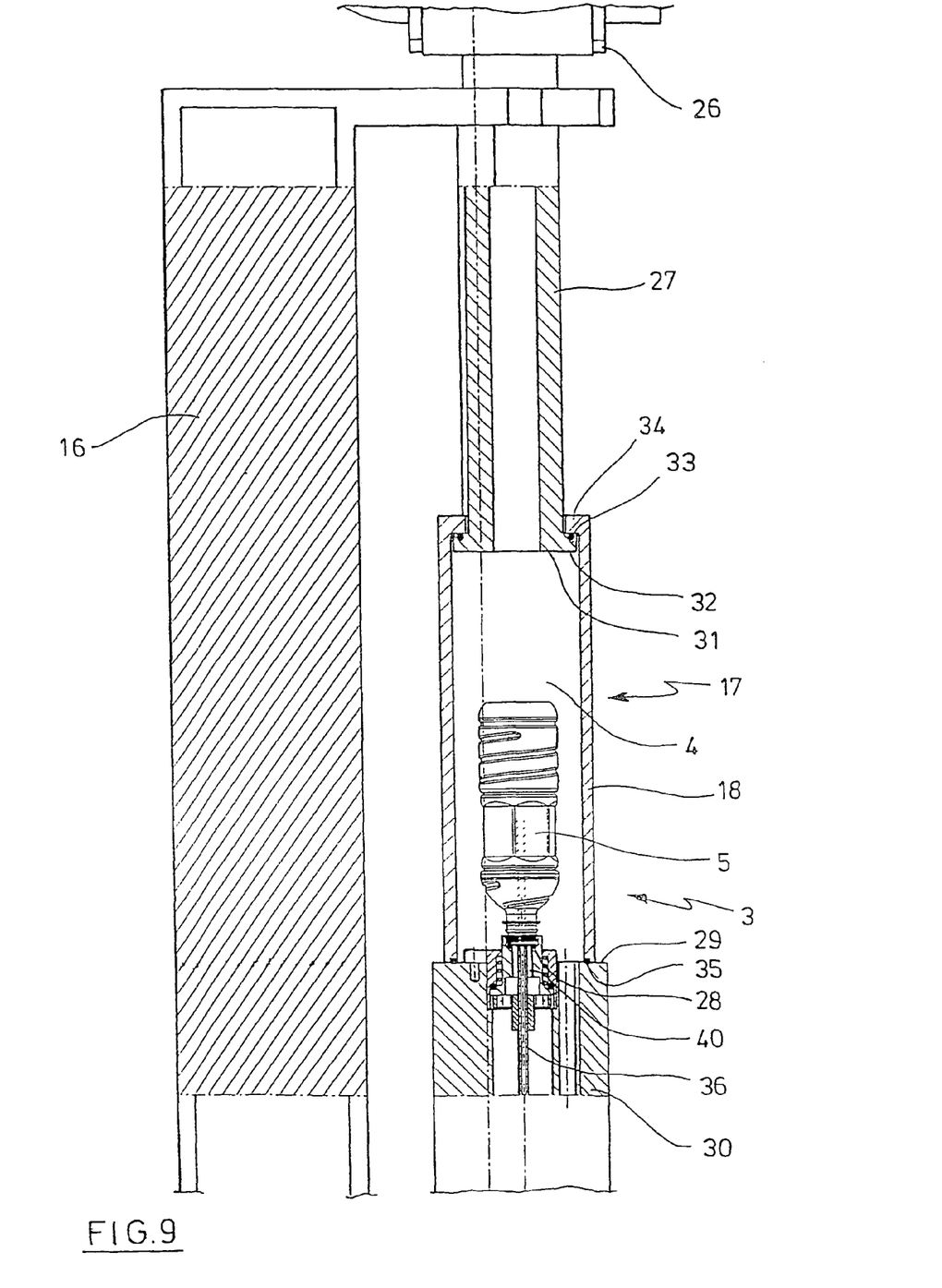
FIG. 9 shows an enlarged view of the plasma chamber with a bottle to be coated in accordance with FIG. 6.

FIG. 9 shows a vertical section in accordance with FIG. 6 in an enlarged partial view of the area around the chamber wall (18). Especially evident in the drawing are the overlapping of the inner flange (34) of the chamber wall (18) over the flange (32) of the chamber lid (31) and the mounting of the workpiece (5) by the mounting element (28). Furthermore, the drawing shows that the lance (36) passes through a hollow space (40) in the mounting element (28).

Figure 10:
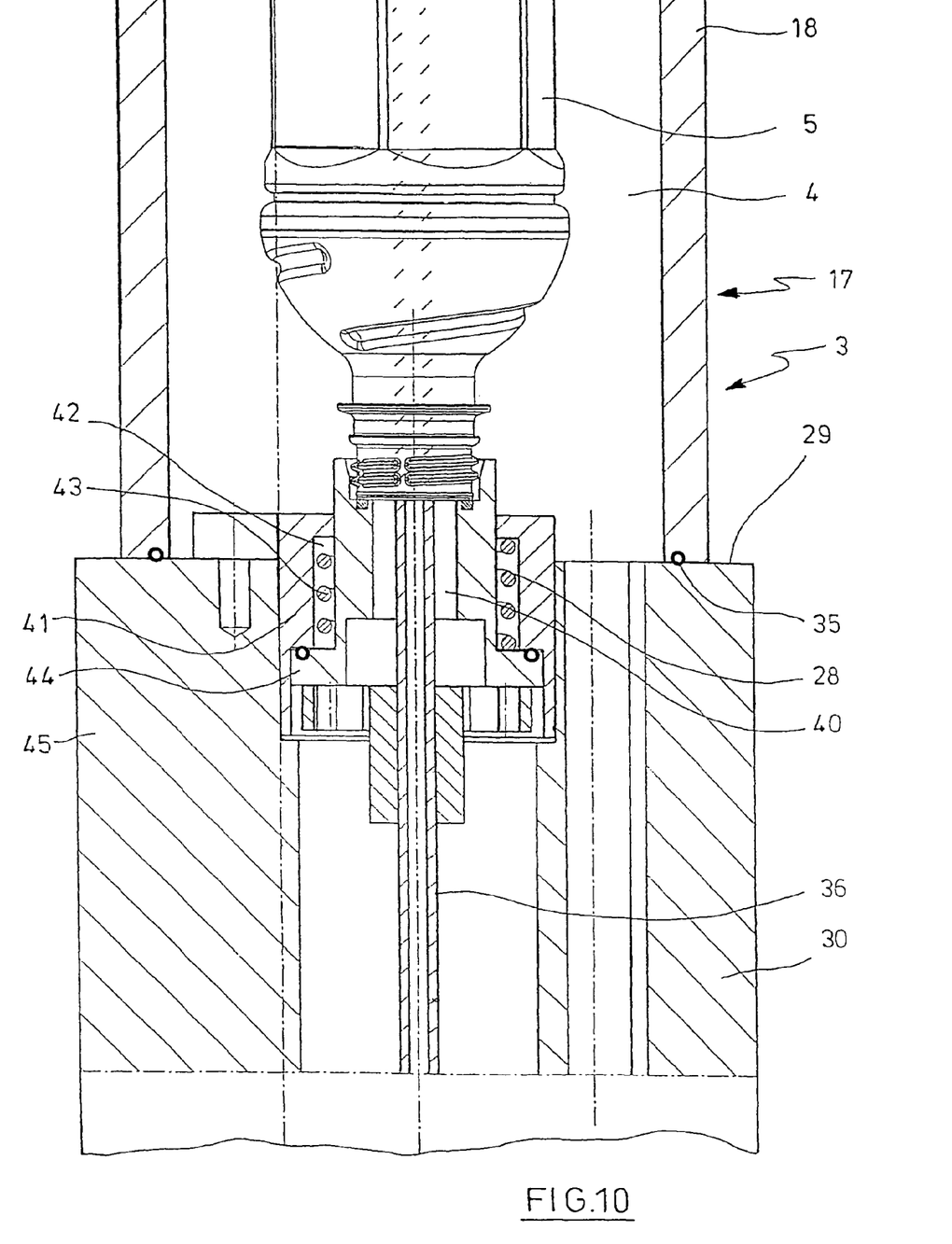
FIG. 10 shows a further enlarged view of a connecting element for mounting the workpiece in the plasma chamber.

The further enlarged view in FIG. 10 shows the positioning of the workpiece (5) in the area of the sealing element (28). The sealing element (28) is inserted in a guide bush (41), which is provided with a spring chamber (42). A compression spring (43) is inserted in the spring chamber (42) and secures an outer flange (44) of the sealing element (28) in place relative to the guide bush (41).

In the position shown in FIG. 10, a push disk (45) mounted on the lance is moved towards the outer flange (44) and pushes the sealing element (28) into its upper terminal position. In this position, the interior of the workpiece (5) is isolated from the interior of the cavity (4). In the lowered state of the lance (36), the compression spring (43) moves the sealing element (28) relative to the guide bush (41) in such a way that the interior of the workpiece (5) communicates with the interior of the cavity (4).

Figure 11:
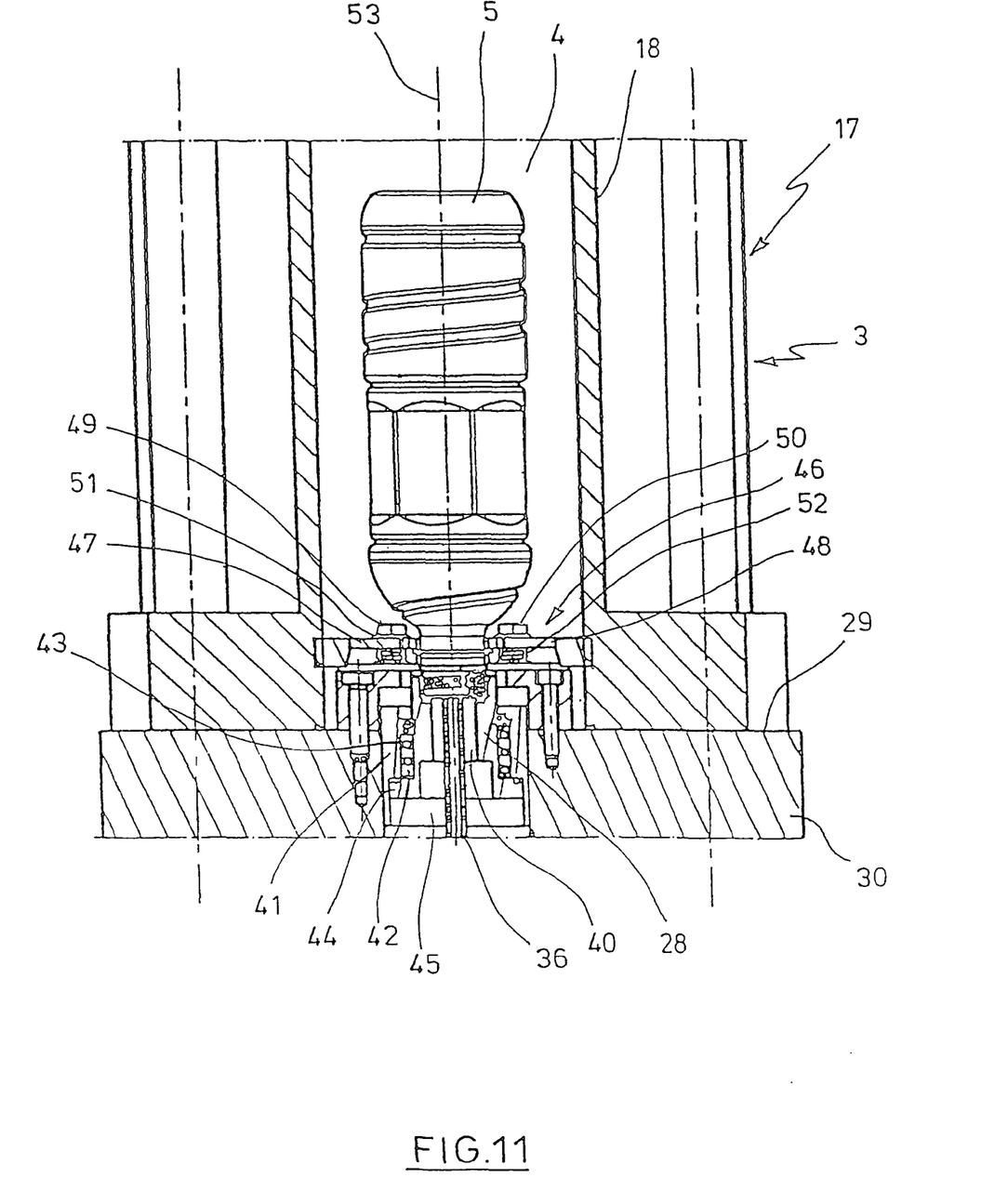
FIG. 11 shows a schematic representation of the positioning of a bottle-shaped workpiece inside the plasma chamber with the use of a tong-shaped mounting element.

FIG. 11 shows the positioning of the workpiece (5) inside the plasma chamber (17) by means of a mounting element (46). The mounting element (46) is shaped like a pair of tongs and has two brackets (47, 48), which are supported in such a way that they can swivel. The brackets (47, 48) can be swiveled relative to axes of rotation (49, 50). To ensure automatic mounting of the workpiece (5) by the mounting element (46), the brackets (47, 48) are pressed into their respective mounting positions by springs (51, 52).

The mounting element (46) is located above the chamber base (30), so that the mounting element (46) is accessible from the side after the chamber wall (18) has been raised. This makes it possible for the workpiece (5) to be transferred to the mounting element (46) by a positioning element without having to carry out a lifting movement of the workpiece (5) along the longitudinal axis (53) of the cavity.

Figure 12:
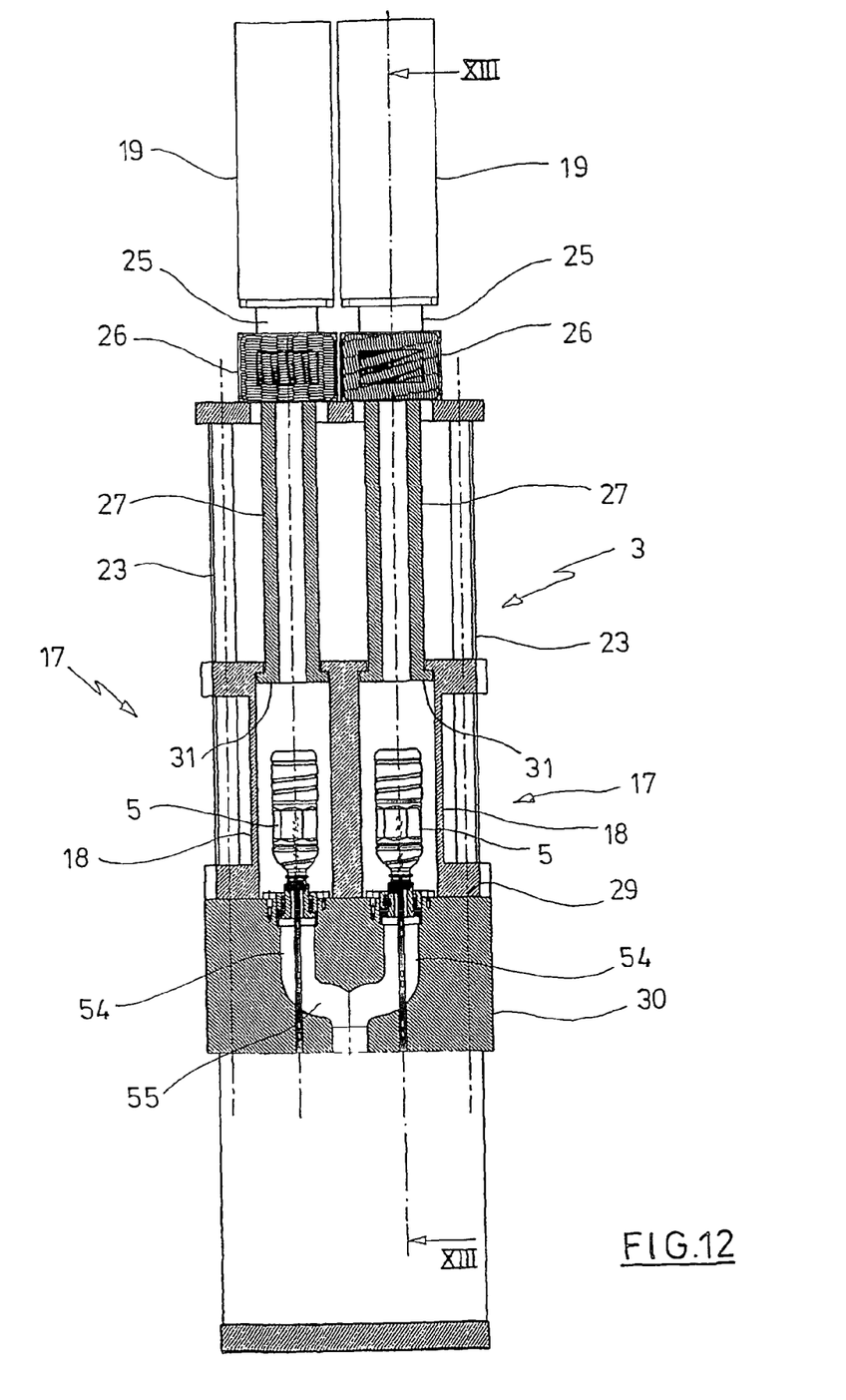
FIG. 12 shows a vertical section of a plasma station with two plasma chambers, which are connected by a duct-like junction to a common supply source of the operating agent.

FIG. 12 shows a plasma station (3) with two plasma chambers (17) for the simultaneous plasma treatment of two workpieces (5). Each of the plasma chambers (17) is connected to its own microwave generator (19) by a coupling duct (27), an adapter (26), and a guide (25). In principle, it is also conceivable to use a common microwave generator (19) for two or more plasma chambers (17) and to split the generated microwave radiation by means of a junction, which is not shown, to ensure uniform ignition of the plasma in each of the plasma chambers (17).

Coupling ducts (54) open into the plasma chambers (17) and are each connected to a junction (55) for splitting a supplied amount of operating agent into two partial amounts. When more than two plasma chambers (17) are used, either the junction (55) is provided with a corresponding number of outlets, or several partial branchings are successively arranged in a cascade. The arrangement of the junction (55) in the immediate vicinity of the plasma chamber (17), as shown in FIG. 12, results in very short coupling ducts (27). When negative pressure is being supplied, this has the advantage that it is necessary to evacuate only a relatively small volume within the coupling ducts (27).

Figure 13:
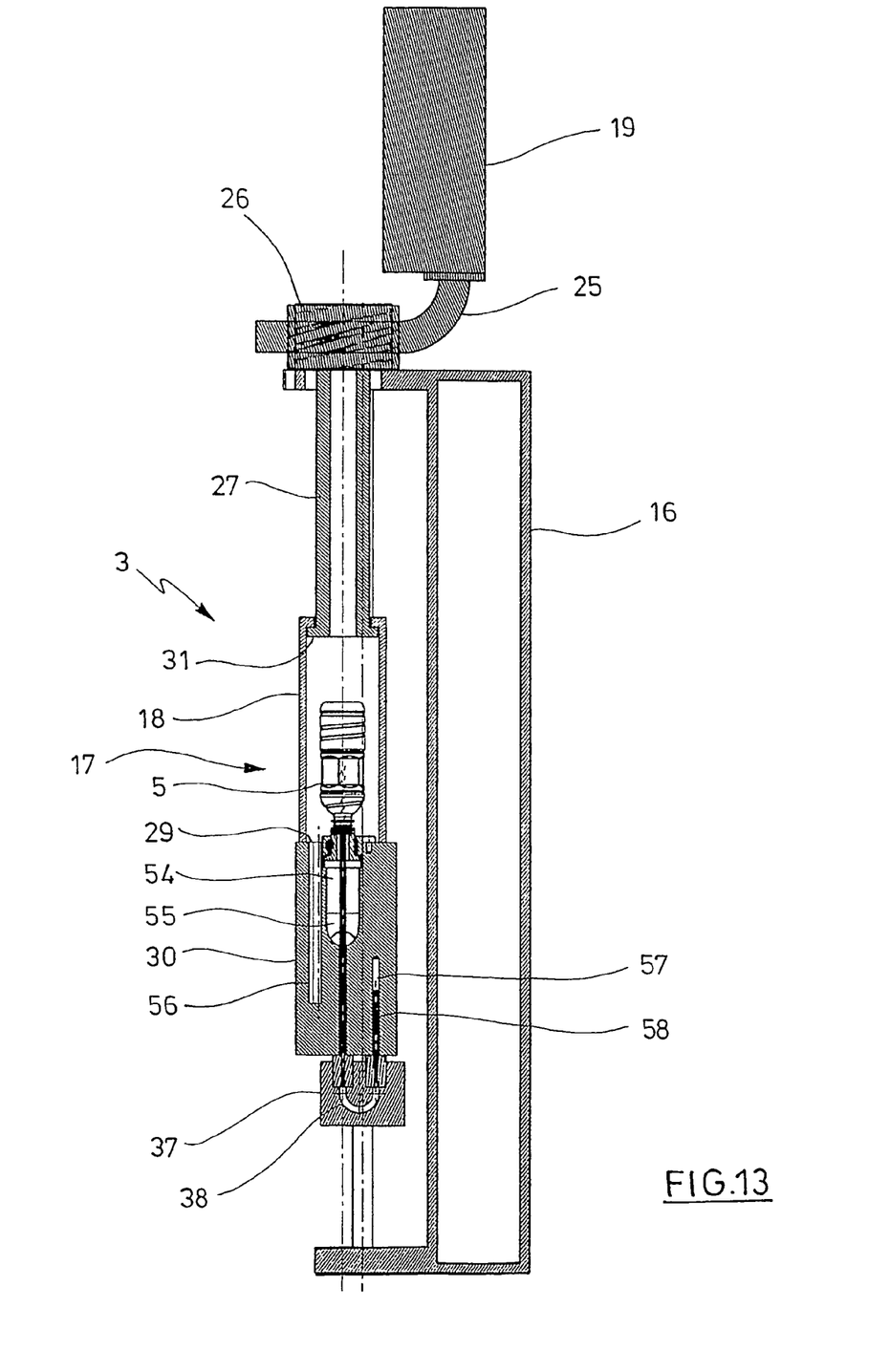
FIG. 13 shows a vertical section along cross-sectional line XIII-XIII in FIG. 12.

FIG. 13 shows a vertical section through the arrangement shown in FIG. 12 with a lance slide (37) additionally drawn. In the illustrated position, the plasma chamber (18) is closed, and the lance slide (37) has been moved against the chamber base (30), so that controlled flow of process gas into the interior of the workpiece (5) can occur.

Chamber channels (56) for connecting the interiors of plasma chambers (17) to the corresponding supply sources for the operating agents and to the positioning channel (57) are located in the region of the chamber base (30). A coupling tube (58), which is sealed and can be moved longitudinally, is guided inside the positioning channel (57). The coupling tube (58) provides a connection with the plasma gas channel (38) inside the lance slide (37). In this way, independently of a given positioning of the lance slide (37) relative to the chamber base (30), the lance (36) is connected to a process gas supply, so that penetration of atmospheric air into the process gas supply is prevented.

Figure 14:
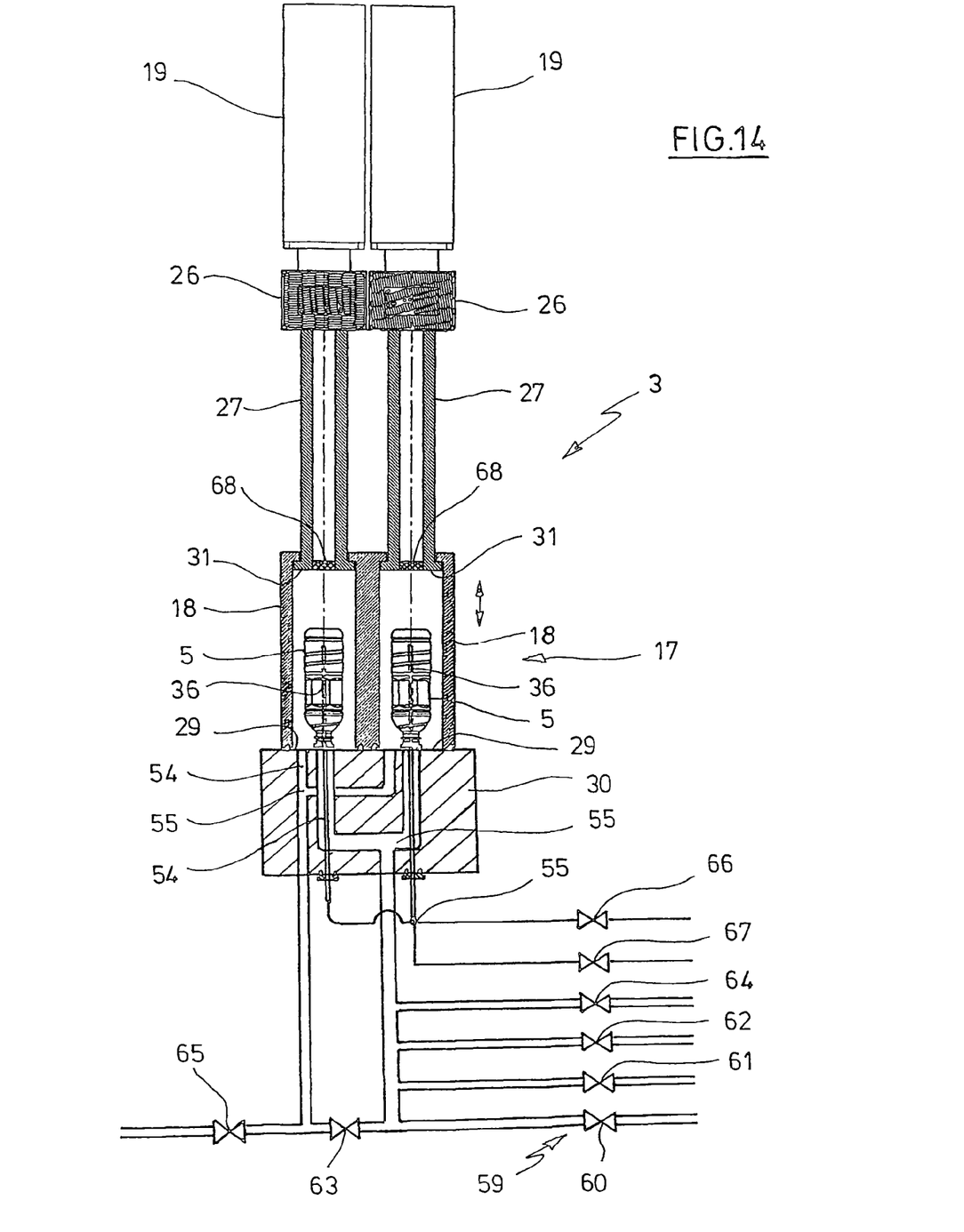
FIG. 14 shows a schematic representation of the connection of a chamber base, which is provided with branching connecting channels, to a plurality of valves.

FIG. 14 shows the arrangement according to FIG. 12 in a highly schematic representation and additionally shows valves (59) for controlling the supply of operating agents. In the embodiment illustrated here, three junctions (55) are used due to the switching arrangement of the coupling ducts (54). Also shown are quartz glass windows (68) for sealing the interiors of the plasma chambers (17) relative to the interiors of the coupling ducts (27), while at the same time allowing the passage of microwave radiation.

The present embodiment employs a primary vacuum valve (60) for providing a first vacuum level and a secondary vacuum valve (61) for providing a vacuum level that is lower than the first vacuum level. In addition, a process vacuum valve (62) is installed for maintaining the vacuum synchronously with the supplying of the process gas. The process vacuum valve (62) prevents process gas that has been drawn in by the vacuum from overflowing into the supply system for the primary vacuum and the secondary vacuum.

To support the selective or common supply of negative pressure to the interior of the workpiece (5) and/or the further interior of the plasma chamber (17), a chamber vacuum valve (63) is used, which has a suitable shutoff function. In particular, it is intended that the respective supply vacuum be supplied in each case directly to the interior of the workpiece (5) through the valves (60, 61, 62), and that a demand-based connection to the further interior of the plasma chamber (17) be carried out by controlling the chamber vacuum valve (63).

A workpiece ventilation valve (64) and a chamber ventilation valve (65) are used to help achieve predeterminable and mutually independent ventilation of both the interior of the workpiece (5) and the further interior of the plasma chamber (17).

A primary process gas valve (66) and a secondary process gas valve (67) are used to help supply different process gas compositions.

A typical treatment operation is explained below for the example of a coating operation and is carried out in such a way that the workpiece (5) is first conveyed to the plasma wheel (2) by means of the input wheel (11), and that the workpiece (5) is inserted into the plasma station (3) with the sleeve-like chamber wall (18) in its raised position. After completion of the insertion operation, the chamber wall (18) is lowered into its sealed position, and then both the cavity (4) and the interior of the workpiece (5) are evacuated, simultaneously at first.

After sufficient evacuation of the interior of the cavity (4), the lance (36) is inserted into the interior of the workpiece (5), and partitioning of the interior of the workpiece (5) from the interior of the cavity (4) is carried out by moving the sealing element (28). It is also possible to start moving the lance (36) into the workpiece (5) synchronously with the start of evacuation of the interior of the cavity. The pressure in the interior of the workpiece (5) is then further reduced. Moreover, it is also possible to carry out the positioning movement of the lance (36) at least partly at the same time as the positioning of the chamber wall (18). After a sufficiently deep negative pressure has been achieved, process gas is introduced into the interior of the workpiece (5), and the plasma is ignited by means of the microwave generator (19). In particular, it is intended that the plasma be used to deposit both an adhesion promoter on the inner surface of the workpiece (5) and the actual barrier layer consisting of silicon oxides.

After a coating operation has been completed, the lance (36) is withdrawn from the interior of the workpiece (5), and the plasma chamber (17) and the interior of the workpiece (5) are ventilated. After ambient pressure has been reached inside the cavity (4), the chamber wall (18) is raised again to allow the coated workpiece (5) to be removed and a new workpiece (5) to be inserted for coating. To allow lateral positioning of the workpiece (5), at least part of the sealing element (28) is moved back into the chamber base (3).

Alternatively to the coating of the internal surface of workpieces (5) that was explained above, it is also possible to coat the external surface or to carry out sterilization or surface activation.

The chamber wall (18), the sealing element (28), and/or the lance (36) can be positioned by means of various types of drive equipment. In principle, it is possible to use pneumatic drives and/or electric drives, especially in the form of linear drives. In particular, however, it is also possible to realize a cam mechanism to help achieve exact coordination of motion with the rotation of the plasma wheel (2). For example, the cam mechanism can be designed in such a way that control cams, along which cam followers are driven, are arranged along the circumference of the plasma wheel (2). The cam followers are coupled with the given components that are to be positioned.

In principle, it is possible to connect several plasma chambers (17) to common valves (59) via the junctions (55). Alternatively or additionally, it is possible to connect several cavities within a plasma chamber with common valves (59) via the junctions. Finally, it is also conceivable, alternatively or additionally with respect to the above variants, to connect several interiors of workpieces (5) within a common plasma chamber (17) or within a common cavity with common valves (59).

The valves (59) are preferably operated by a programmable electronic control system. After the plasma chamber (17) has been closed, the primary vacuum valve (60) is first opened, and the interior of the workpiece (5) and the interior of the plasma chamber (17) are simultaneously evacuated. This produces a pressure level on the order of 20 mbars to 50 mbars. After the primary vacuum valve (60) has been closed, the secondary vacuum valve (61) is opened, and, simultaneously at first, the interior of the workpiece (5) and the interior of the plasma chamber (17) are connected to a vacuum source with a lower pressure level. After sufficient evacuation of the interior of the plasma chamber (17) that surrounds the workpiece (5), the chamber vacuum valve (63) closes, and only the interior of the workpiece (5) is further evacuated. This results in the production of a pressure level of about 0.1 mbar.

After the chamber vacuum valve (63) has been closed, and after the lance (36) has been positioned in the interior of the workpiece (5), which has usually been accomplished in advance, the primary process gas valve (66) opens, and a process gas of a first composition is supplied. To supply the lance (36) with process gas, it is intended especially that the gas connections (39) in the area of the chamber base (30), which are shown, for example, in FIG. 6, be designed in such a way that a tubular coupling element is supported in a bore-like recess in a way that allows it to move in a longitudinal direction. A seal can be provided by a dynamic annular seal. The tubular connecting element is supported by the lance slide (37) and produces a connection to the plasma channel (38) inside the lance slide (37). A connection with the process gas distribution system is guaranteed for each positioning of the lance slide (37) by a corresponding movement of the tubular connecting element within the bore-like recess.

After a sufficient amount of process gas has been supplied, the microwave generator (19) ignites the plasma in the interior of the workpiece (5). At a predeterminable time, the primary process gas valve (66) closes, and the secondary process gas valve (67) opens to supply a process gas of a second composition. At least from time to time, the process vacuum valve (62) also opens when the process gas valves (66, 67) open in order to maintain a sufficiently low vacuum in the interior of the workpiece (5). A pressure level of about 0.3 mbar is found to be effective here.

After the completion of a plasma coating, first the workpiece ventilation valve (64) opens and connects the interior of the workpiece (5) to ambient pressure. With a predeterminable time delay after the opening of the workpiece ventilation valve (64), the chamber ventilation valve (65) also opens to raise the interior pressure of the plasma chamber (17) completely back to ambient pressure. After ambient pressure has been at least approximately established inside the plasma chamber (17), the plasma chamber (17) can open, and the coated workpiece (5) is removed and replaced by a new workpiece (5) to be coated. To remove possible residues of the plasma treatment process inside the workpiece (5), it is possible to introduce compressed air into the workpiece (5) before the workpiece (5) is removed from the plasma chamber (17) and in this way to remove any contaminants that may be present. The compressed air can be evacuated into the surroundings of, the plasma station (3), but it is especially intended that one of the vacuum connections should be activated at the same time that the compressed air is admitted, so that the contaminants are removed by suction in a well-defined way. Alternatively, it is also possible to carry out the cleaning operation exclusively by an additional vacuum application and to complete it by then allowing atmospheric air to flow through.

In regard to the admission of compressed air, it is especially intended that the compressed air should be supplied through the lance (36), since this allows the flushing air to be introduced into a part of the interior of the workpiece (5) that faces away from the opening of the workpiece (5). This helps achieve a flow of flushing air in the direction of the opening of the workpiece (5) and results in an effective cleaning operation.

The invention claimed is:

1. Device for the plasma treatment of workpieces, which has at least two plasma chambers which can be evacuated, each of the plasma chambers being configured for receiving a workpiece, wherein the plasma chambers are located in the area of a treatment station, and in which each of the plasma chambers is bounded by a chamber floor, a chamber lid, and a lateral chamber wall and has at least one mounting element for positioning the workpiece, wherein the lateral chamber wall is movable vertically relative to the chamber floor, wherein at least two plasma chambers (17) are connected to at least one junction (55) for splitting a stream of an operating agent into at least two split streams, wherein the plasma station (3) is designed for coating the interior of workpieces (5) that are formed as a hollow plastic bottles arranged vertically in the plasma station with a mouth of the bottles directed downwardly, wherein the one or more plasma stations (3) are supported by a rotating plasma wheel (2), wherein the at least one junction (55) is connected to a primary vacuum valve (60) for connecting a first negative pressure, and wherein the at least one junction (55) is connected to a secondary vacuum valve (61) for connecting a lower negative pressure relative to the first negative pressure, wherein the at least one junction (55) connected to the secondary vacuum valve (61) is located in the area of a chamber base (30) for supplying the negative pressure to the interior of each of the plasma chambers that surrounds the workpiece, wherein at least one further junction (55) is connected to at least one process gas feed that provides process gas needed for producing a coating by precipitating $SiO_x$, one junction opens into the interior of the workpieces and another junction opens into the interior of the plasma stations, wherein a negative pressure source for providing the lower negative pressure is connectable with the interior of the workpieces via the at least one junction so as to provide a vacuum of from 0.1-0.3 mbar, wherein the chamber base is fixed relative to the plasma stations, wherein at least one junction (55) is connected to a workpiece ventilation valve (64) for connecting the interior of the workpieces (5) to ambient pressure.

2. Device in accordance with claim 1, wherein the junction (55) runs in a vertical direction.

3. Device in accordance with claim 1, wherein the junction (55) runs in a horizontal direction.

4. Device in accordance with claim 1, wherein at least one vacuum duct is located in the chamber floor (29) for evacuating a cavity (4) of the plasma station (3).

5. Device in accordance with claim 1, wherein at least one duct for supplying process gas is located in the chamber floor (29).

6. Device in accordance with claim 1, wherein a lance (36) can be positioned relative to the chamber floor (29) for feeding process gas into the interior of the workpiece (5).

7. Device in accordance with claim 1, wherein at least one junction (55) is directly connected to interiors of at least two plasma chambers (17).

8. Device in accordance with claim 1, wherein at least one junction (55) is connected to a coupling duct (54) for connecting interiors of at least two workpieces (5).

9. Device in accordance with claim 1, wherein at least one junction (55) is connected to at least two lances (36).

10. Device in accordance with claim 1, wherein at least one junction (55) is connected to at least one vacuum source.

11. Device in accordance with claim 1, wherein at least one junction (55) is connected to at least one air feed.

12. Device in accordance with claim 1, wherein a microwave generator (19) is installed in the vicinity of the chamber lid (31).

13. Device in accordance with claim 1, wherein the plasma station (3) is designed for coating a workpiece (5) made of a thermoplastic material.

14. Device in accordance with claim 1, wherein several cavities (4) are arranged in the area of the plasma station (3).

15. Device in accordance with claim 1, wherein a chamber wall (18) provided for supplying at least two cavities (4) is arranged in such a way that it can be positioned.

16. Device in accordance with claim 1, wherein the primary vacuum valve (60) at least temporarily connects both the interior of the workpiece (5) and another interior space of the plasma chamber (17) to a common vacuum source.

17. Device in accordance with claim 1, wherein the secondary vacuum valve (61) at least temporarily connects exclusively the interior of the workpiece (5) with the vacuum source.

18. Device in accordance with claim 1, wherein at least one junction (55) is connected to a chamber ventilation valve (61) for connecting the interior of the plasma chamber (17) to ambient pressure.

19. Device in accordance with claim 1, wherein at least one junction (55) is connected to a primary process gas valve (66).

20. Device in accordance with claim 1, wherein at least one junction (55) is connected to a secondary process gas valve (67).

21. Device in accordance with claim 1, wherein at least one junction (55) is connected to a process vacuum valve (62).

22. Device in accordance with claim 1, wherein at least one junction (55) is connected to a chamber vacuum valve (63).

23. Device in accordance with claim 1, wherein at least one junction (55) is located in the area of a chamber base (30) of the plasma station (3).

24. Device in accordance with claim 1, wherein at least one junction (55) is arranged vertically below the chamber floor.

25. Device in accordance with claim 1, wherein at least one junction (55) forms a common component with the chamber base (30).

26. Device in accordance with claim 1, wherein at least two of the valves (59) are arranged in the area of a common valve block.

27. Device in accordance with claim 26, wherein the valve block with the two or more valves (59) and the one or more junctions (55) is arranged vertically below the chamber base (30).

28. Device in accordance with claim 1, wherein at least one of the junctions (55) is located in the area of the valve block.

29. Device in accordance with claim 1, wherein the valve block forms a common component with at least one junction (55).

30. Device in accordance with claim 1, wherein at least one of the valves (59) is designed as an electromagnetically controlled valve.

* * * * *